United States Patent
Dienstbier

(10) Patent No.: US 11,664,160 B2
(45) Date of Patent: May 30, 2023

(54) POWER SEMICONDUCTOR DEVICE AND A METHOD FOR PRODUCING A POWER SEMICONDUCTOR DEVICE

(71) Applicant: SEMIKRON ELEKTRONIK GMBH & CO. KG, Nuremberg (DE)

(72) Inventor: Markus Dienstbier, Greding (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 65 days.

(21) Appl. No.: 17/537,322

(22) Filed: Nov. 29, 2021

(65) Prior Publication Data
US 2022/0181079 A1    Jun. 9, 2022

(30) Foreign Application Priority Data

Dec. 8, 2020  (DE) ..................... 10 2020 132 679.3

(51) Int. Cl.
| | |
|---|---|
| *H01G 2/08* | (2006.01) |
| *H01G 2/06* | (2006.01) |
| *H01G 4/40* | (2006.01) |
| *H05K 7/14* | (2006.01) |
| *H05K 7/20* | (2006.01) |
| *H05K 1/11* | (2006.01) |

(52) U.S. Cl.
CPC ................. *H01G 2/08* (2013.01); *H01G 2/06* (2013.01); *H01G 4/40* (2013.01); *H05K 1/11* (2013.01); *H05K 7/1432* (2013.01); *H05K 7/209* (2013.01)

(58) Field of Classification Search
None
See application file for complete search history.

(56) References Cited

U.S. PATENT DOCUMENTS

| | | | |
|---|---|---|---|
| 2008/0007919 A1* | 1/2008 | Isomoto | H05K 7/209 361/709 |
| 2011/0299265 A1* | 12/2011 | Nakatsu | H01L 25/072 361/820 |

(Continued)

FOREIGN PATENT DOCUMENTS

DE    202016101292 U1    4/2016

OTHER PUBLICATIONS

DE 10 2020 132 679.3, German Search Report dated May 12, 2021, 5 pages—German, 5 pages—English.

*Primary Examiner* — Krystal Robinson
(74) *Attorney, Agent, or Firm* — Andrew F. Young; Nolte Lackenbach Siegel

(57) ABSTRACT

A power semiconductor device has a substrate on which power semiconductor switches are arranged and has a circuit board which includes conductive first plug-in connection contacts, a capacitor, a capacitor holding element that includes a reception device for receiving the capacitor, a temperature sensor for the capacitor, a temperature sensor holding element that has a plug-in region for conductive second plug-in connection contacts. There are temperature sensor connecting lines which electrically connect the temperature sensor and the second plug-in connection contacts to one another, at least one section of a temperature sensor connecting line being configured as a conductor track on the temperature sensor holding element, the second plug-in connection contacts forming an electrically conductive plug-in connection with the first plug-in connection contacts.

14 Claims, 3 Drawing Sheets

(56) References Cited

U.S. PATENT DOCUMENTS

| | | | | |
|---|---|---|---|---|
| 2012/0014059 A1* | 1/2012 | Zeng | ................. | H02M 7/003 |
| | | | | 361/730 |
| 2013/0279230 A1* | 10/2013 | Suwa | ................. | H05K 7/20509 |
| | | | | 363/141 |
| 2019/0307025 A1* | 10/2019 | King | ................. | H01L 23/3736 |
| 2019/0319551 A1* | 10/2019 | Song | ................. | H02M 7/5387 |

* cited by examiner

POWER SEMICONDUCTOR DEVICE AND A METHOD FOR PRODUCING A POWER SEMICONDUCTOR DEVICE

CROSS REFERENCE TO RELATED APPLICATIONS

This application relates to and claims priority to DE 10 2020 132 679.3 filed Dec. 8, 2020, the entire contents of which are incorporated herein fully by reference.

FIGURE SELECTED FOR PUBLICATION

FIG. 2

BACKGROUND OF THE INVENTION

Field of the Invention

The invention relates to a power semiconductor device and to a method for producing a power semiconductor device.

Description of the Related Art

DE 20 2016 101 292 U1 discloses a power semiconductor device having a substrate on which power semiconductor switches are arranged and are electrically conductively connected to the substrate, having a circuit board, the normal direction of which extends perpendicularly to the normal direction of the substrate, having a capacitor which is electrically conductively connected to the substrate, and having a capacitor holding element which comprises a reception device for receiving the capacitor, the capacitor being arranged in the reception device.

During the operation of such a power semiconductor device, the capacitor becomes heated. In order to avoid overheating of the capacitor, the technical requirement of measuring the temperature of the capacitor arises.

ASPECTS AND SUMMARY OF THE INVENTION

It is an object of the invention to provide an efficiently producible power semiconductor device in which the temperature of the capacitor of the power semiconductor device can be measured reliably.

This object is achieved by a power semiconductor device having a substrate on which power semiconductor switches are arranged and are electrically conductively connected to the substrate, having a circuit board, the normal direction of which extends perpendicularly to the normal direction of the substrate, the circuit board comprising electrically conductive first plug-in connection contacts, having a capacitor which is electrically conductively connected to the substrate, having a capacitor holding element which comprises a reception device for receiving the capacitor, the capacitor being arranged in the reception device, having a temperature sensor intended for measuring the temperature of the capacitor, having a temperature sensor holding element which comprises a plug-in connection region on which electrically conductive second plug-in connection contacts are arranged, the temperature sensor being connected to the temperature sensor holding element and the temperature sensor holding element being connected to the capacitor holding element, having temperature sensor connecting lines which electrically conductively connect the temperature sensor and the second plug-in connection contacts to one another, at least one section of a temperature sensor connecting line being arranged inside the temperature sensor holding element and being materially bonded to the temperature sensor holding element, and/or at least one section of a temperature sensor connecting line being configured as a conductor track arranged on the temperature sensor holding element, the second plug-in connection contacts forming an electrically conductive plug-in connection with the first plug-in connection contacts.

It is found advantageous for the temperature sensor holding element to be formed from plastic, the at least one section of the temperature sensor connecting line being arranged inside the temperature sensor holding element and being materially bonded to the temperature sensor holding element by the at least one section of the temperature sensor connecting line being injection-molded into the temperature sensor holding element. In this way, the at least one section of the temperature sensor connecting line is protected against damage by the temperature sensor holding element plastic which surrounds it.

It is also found advantageous for the temperature sensor holding element to be formed from plastic, the temperature sensor being connected to the temperature sensor holding element by at least a part of the temperature sensor being injection-molded into the temperature sensor holding element. In this way, the temperature sensor is connected to the temperature sensor holding element very durably in relation to mechanical loads, for example mechanical oscillations, which occur during operation of the power semiconductor device.

It is furthermore found advantageous for a signal processing circuit for signal processing of a temperature sensor signal generated by the temperature sensor to be arranged on the circuit board. In this way, the signal processing of the temperature sensor signal generated by the temperature sensor takes place in the vicinity of the temperature sensor, so that EMC interference which acts on the temperature sensor signal is reduced.

It is furthermore found advantageous for driver control circuits for driving the power semiconductor switches to be arranged on the circuit board. The circuit board on which the driver control circuits for driving the power semiconductor switches are also arranged may therefore be used as the circuit board.

It is also found advantageous for the first plug-in connection contacts to be configured as metallization regions of the circuit board. In this way, the first plug-in connection contacts are configured particularly reliably.

It is furthermore found advantageous for at least two of the first plug-in connection contacts to be arranged on mutually opposite main sides of the circuit board. In this way, the first plug-in connection contacts are configured particularly reliably.

It is furthermore found advantageous for the temperature sensor to be thermally conductively coupled to the capacitor. In this way, the temperature of the capacitor can be determined particularly accurately by the temperature sensor.

It is furthermore found advantageous for the power semiconductor device to comprise a base plate, the substrate being arranged on the base plate. In this way, the heat generated by the power semiconductor switches during their operation is transferred to the base plate via the substrate.

It is also found advantageous for the base plate to be an integral part of a heat sink or to be intended for arrangement on a heat sink. In this way, the heat generated by the power semiconductor switches during their operation can be dissipated reliably.

It is also found advantageous for the temperature sensor holding element to be connected to the capacitor holding element by the temperature sensor holding element being formed in one piece with the capacitor holding element. In this way, the temperature sensor holding element is connected to the capacitor holding element very durably in relation to mechanical loads, for example mechanical oscillations, which occur during operation of the power semiconductor device.

It is furthermore found advantageous for the temperature sensor holding element to be connected to the capacitor holding element by the temperature sensor holding element being connected to the capacitor holding element by means of a force-fit or form-fit connection. In this way, the capacitor holding element and the temperature sensor holding element may be produced separately from one another. Furthermore, a force-fit or form-fit connection is particularly simple to produce.

This object is furthermore achieved by a method for producing a power semiconductor device according to the invention, having the following method steps:
 a) providing a first arrangement having a substrate on which power semiconductor switches are arranged and are electrically conductively connected to the substrate, having a circuit board, the normal direction of which extends perpendicularly to the normal direction of the substrate, the circuit board comprising electrically conductive first plug-in connection contacts, and having a capacitor which is electrically conductively connected to the substrate,
 b) providing a second arrangement having a capacitor holding element which comprises a reception device for receiving the capacitor, having a temperature sensor intended for measuring the temperature of the capacitor, having a temperature sensor holding element which comprises a plug-in connection region on which electrically conductive second plug-in connection contacts are arranged, the temperature sensor being connected to the temperature sensor holding element and the temperature sensor holding element being connected to the capacitor holding element, having temperature sensor connecting lines which electrically conductively connect the temperature sensor and the second plug-in connection contacts to one another, at least one section of a temperature sensor connecting line being arranged inside the temperature sensor holding element and being materially bonded to the temperature sensor holding element, and/or at least one section of a temperature sensor connecting line being configured as a conductor track arranged on the temperature sensor holding element,
 c) relatively moving the first and second arrangements towards one another in such a way that the capacitor is inserted into the reception device and the second plug-in connection contacts form an electrically conductive plug-in connection with the first plug-in connection contacts.

This object is furthermore achieved by a method for producing a power semiconductor device according to the invention, having the following method steps:
 a) providing a first arrangement having a substrate on which power semiconductor switches are arranged and are electrically conductively connected to the substrate, having a circuit board, the normal direction of which extends perpendicularly to the normal direction of the substrate, the circuit board comprising electrically conductive first plug-in connection contacts, and having a capacitor which is electrically conductively connected to the substrate,
 b) providing a capacitor holding element which comprises a reception device for receiving the capacitor,
 c) providing a temperature sensor intended for measuring the temperature of the capacitor and a temperature sensor holding element which comprises a plug-in connection region on which electrically conductive second plug-in connection contacts are arranged, the temperature sensor being connected to the temperature sensor holding element, and providing temperature sensor connecting lines which electrically conductively connect the temperature sensor and the second plug-in connection contacts to one another, at least one section of a temperature sensor connecting line being arranged inside the temperature sensor holding element and being materially bonded to the temperature sensor holding element, and/or at least one section of a temperature sensor connecting line being configured as a conductor track arranged on the temperature sensor holding element,
 d) obtaining a second arrangement by relatively moving the first arrangement and the capacitor holding element towards one another in such a way that the capacitor is inserted into the reception device,
 e) relatively moving the temperature sensor holding element and the second arrangement towards one another in such a way that the temperature sensor holding element is connected to the capacitor holding element with a force fit or form fit, and the second plug-in connection contacts form an electrically conductive plug-in connection with the first plug-in connection contacts.

It should be noted that in the scope of the invention, a relative movement of the first and second arrangements towards one another means both a movement of the first arrangement towards the second arrangement and a movement of the second arrangement towards the first arrangement, as well as a simultaneous movement of the first and second arrangements towards one another.

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
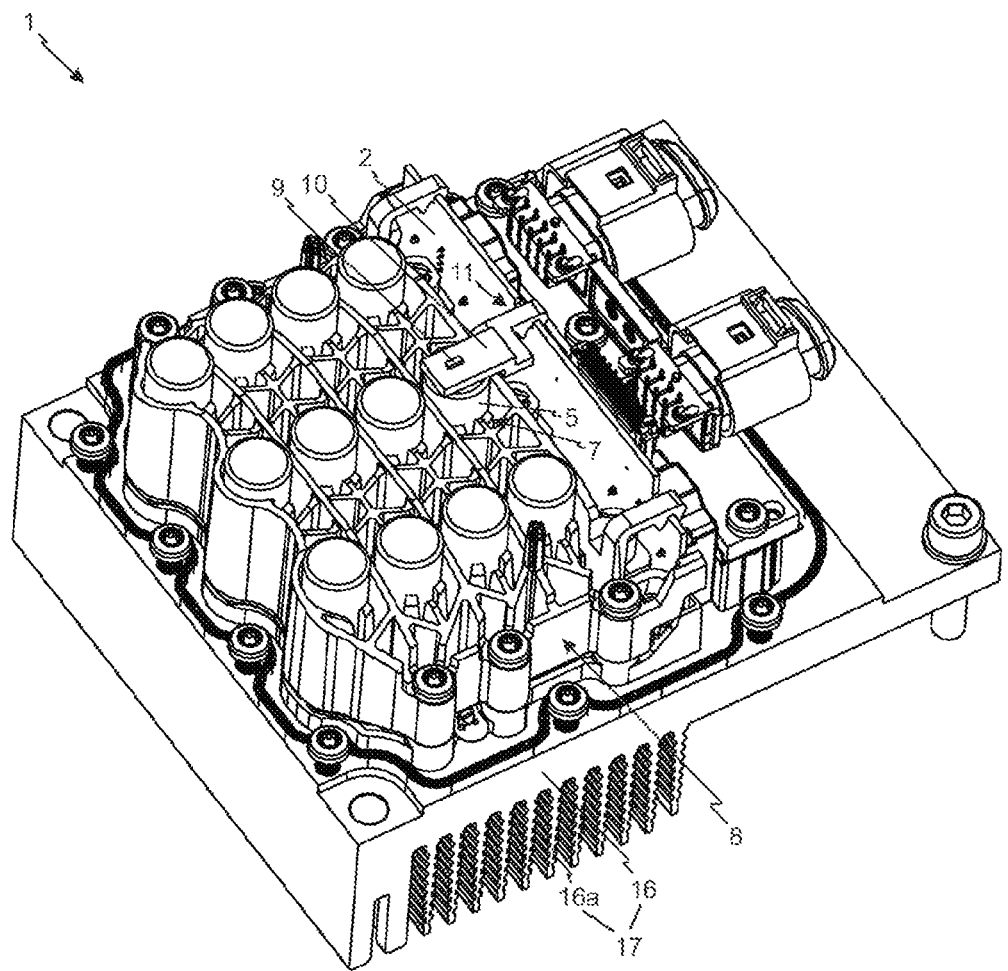
FIG. 1 shows a perspective view of a power semiconductor device according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Figure 2:
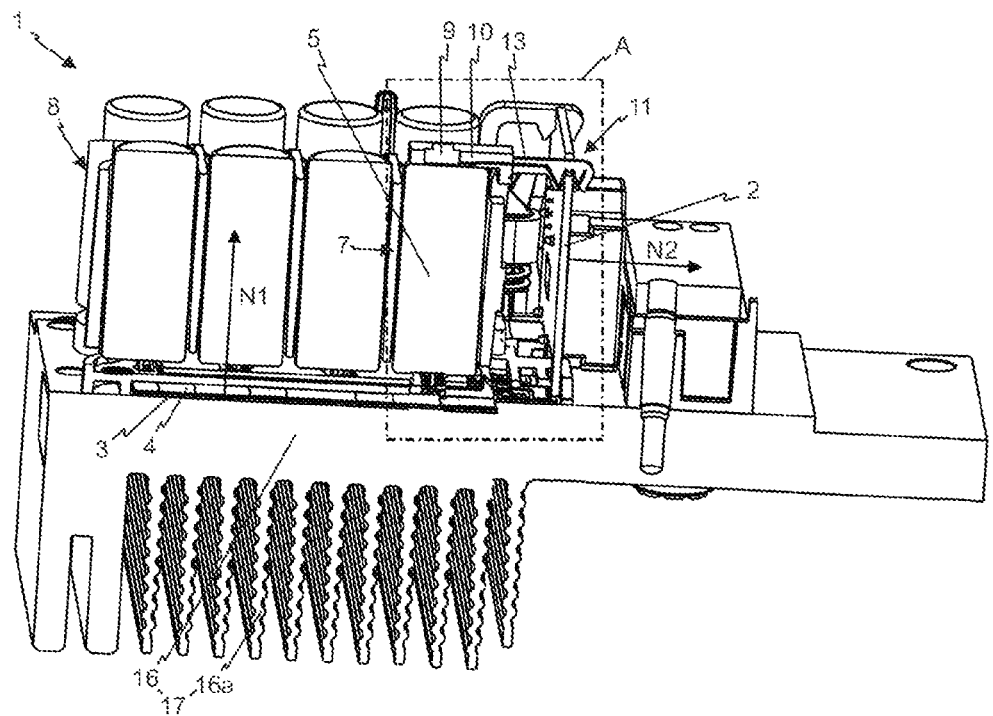
FIG. 2 shows a perspective sectional view of a power semiconductor device according to the invention.
Figure 3:
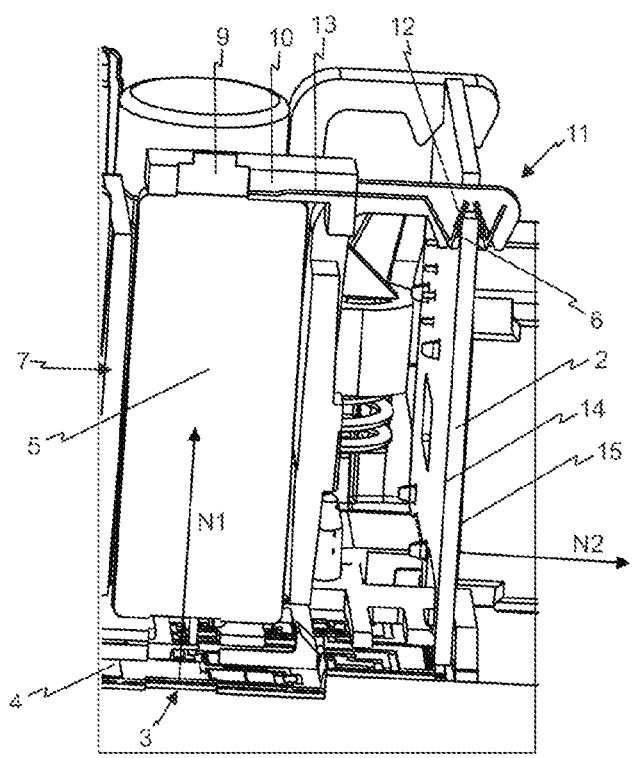
FIG. 3 shows a detail view of a region A of FIG. 2.
Figure 4:
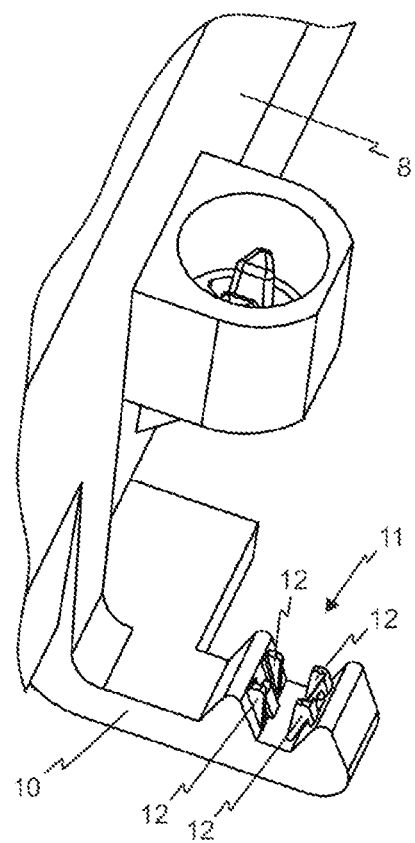
FIG. 4 shows a detail view of a temperature sensor holding element of a power semiconductor device according to the invention.
Figure 5:
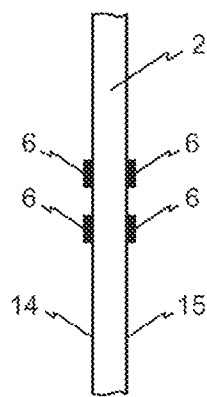
FIG. 5 shows a circuit board of a power semiconductor device according to the invention.

Referring now to FIG. 1, FIG. 2 and FIG. 3 that represent views of a power semiconductor device 1 according to the invention. FIG. 4 represents a detail view of a temperature sensor holding element 10 of the power semiconductor device 1 and FIG. 5 represents a circuit board 2 of the power semiconductor device 1.

The power semiconductor device 1 according to the invention comprises a substrate 3 on which power semiconductor switches 4 are arranged and are electrically conductively connected to the substrate 3, for example by means of a soldering or sintering connection. The power semiconductor switches 4 are preferably interconnected to form at least one half-bridge circuit. The power semiconductor switches 4 are generally in the form of transistors, for example IGBTs (insulated gate bipolar transistors) or MOSFETs (metal oxide semiconductor field effect transistors) or in the form of thyristors. The substrate 3 may for example be configured as a direct copper bonded substrate (DCB substrate), as an active metal brazing substrate (AMB substrate) or as an insulated metal substrate (IMS). The power semiconductor device 1 is configured to generate at least one AC voltage from a DC voltage or to generate a DC voltage from at least one AC voltage.

The power semiconductor device 1 preferably comprises a base plate 16, on which the substrate 3 is arranged. The base plate 16 may, as in the exemplary embodiment, be an integral part of a heat sink 17. The heat sink may be configured as an air heat sink or as a liquid heat sink, in particular as a water heat sink. Cooling fins 16a or cooling pins of the heat sink 17 preferably extend from the base plate 16. It should be noted that the base plate 16 may also be intended to be arranged on a heat sink.

The power semiconductor device 1 furthermore comprises a circuit board 2, the normal direction N2 of which extends perpendicularly to the normal direction N1 of the substrate 3. The circuit board 2 comprises electrically conductive first plug-in connection contacts 6. Driver control circuits for driving the power semiconductor switches 4 are preferably arranged on the circuit board 2. The first plug-in connection contacts 6 are preferably configured as metallization regions of the circuit board 2. At least two of the first plug-in connection contacts 6 are preferably arranged on mutually opposite main sides 14 and 15 of the circuit board 2 (see FIG. 5).

The power semiconductor device 1 furthermore comprises a capacitor 5, which is electrically conductively connected to the substrate 3, and a capacitor holding element 8 which comprises a reception device 7 for receiving the capacitor 5. The capacitor 5 is arranged in the reception device 7. The capacitor 5 is preferably used as a link capacitor.

The power semiconductor device 1 furthermore comprises a temperature sensor 9 intended for measuring the temperature of the capacitor 5 and a temperature sensor holding element 10, which comprises a plug-in connection region 11 on which electrically conductive second plug-in connection contacts 12 are arranged. The temperature sensor 9 is connected to the temperature sensor holding element 10 and the temperature sensor holding element 10 is connected to the capacitor holding element 8. The temperature sensor holding element 10 may be connected to the capacitor holding element 8 by the temperature sensor holding element 10 being formed in one piece with the capacitor holding element 8. The temperature sensor holding element 10 and the capacitor holding element 8 are, as in the exemplary embodiment, preferably configured as integral parts of a common plastic component. As an alternative, the temperature sensor holding element 10 may be connected to the capacitor holding element 8 by the temperature sensor holding element 10 being connected to the capacitor holding element 8 by means of a force-fit or form-fit connection. The form-fit connection may, for example, be configured as a snap-fit connection. The temperature sensor holding element 10 may in this case comprise a snap hook.

The temperature sensor 9 is preferably thermally conductively coupled to the capacitor 5. The temperature sensor 9 is preferably in mechanical contact with the capacitor 5. A signal processing circuit for signal processing of a temperature sensor signal generated by the temperature sensor 9 is preferably arranged on the circuit board 2. The signal processing may, for example, be in the form of an amplifier circuit or an adapter circuit, which amplifies the temperature sensor signal or adapts the temperature sensor signal for the further processing.

The temperature sensor holding element 10 is preferably formed from plastic, the temperature sensor 9 being connected to the temperature sensor holding element 10 by at least a part of the temperature sensor 9 being injection-molded into the temperature sensor holding element 10.

The power semiconductor device 1 furthermore comprises temperature sensor connecting lines 13, which electrically conductively connect the temperature sensor 9 and the second plug-in connection contacts 12 to one another.

At least one section of the temperature sensor connecting line 13, in particular the entire temperature sensor connecting line 13, is preferably, as in the exemplary embodiment, arranged inside the temperature sensor holding element 10 and materially bonded to the temperature sensor holding element 10. The temperature sensor holding element 10 is preferably formed from plastic, the at least one section of the temperature sensor connecting line 13 being arranged inside the temperature sensor holding element 10 and being materially bonded to the temperature sensor holding element 10 by the at least one section of the temperature sensor connecting line 13 being injection-molded into the temperature sensor holding element 10.

At least one section of the temperature sensor connecting line 13, in particular the entire temperature sensor connecting line 13, may also be configured as a conductor track arranged on the temperature sensor holding element 10. The temperature sensor holding element 10 is for this purpose preferably formed from plastic, and the at least one section of the temperature sensor connecting line 13 is formed as a conductor track applied onto the temperature sensor holding element 10, for example by means of MID (molded interconnected device) technology. For this purpose, for example, a metallization may be applied onto the temperature sensor holding element 10 and subsequently structured.

It should be noted that in addition at least one section of the temperature sensor connecting line 13 may be arranged inside the temperature sensor holding element 10 and at least one section of the temperature sensor connecting line 13 may be configured as a conductor track arranged on the temperature sensor holding element 10.

The second plug-in connection contacts 12 form an electrically conductive plug-in connection with the first plug-in connection contacts 6.

It should be noted that the power semiconductor device 1 may, as in the exemplary embodiment, comprise a plurality of capacitors 5 and the capacitor holding element 8 may comprise a plurality of reception devices 7 for receiving the capacitors, in which the capacitors 5 are arranged. In the exemplary embodiment, the power semiconductor device 1 comprises a temperature sensor 9 intended for measuring the temperature of one of the capacitors 5.

A method for producing the power semiconductor device 1 will be described below.

In a method step a), a first arrangement having a substrate 3 on which power semiconductor switches 4 are arranged and are electrically conductively connected to the substrate 3, having a circuit board 2, the normal direction N2 of which extends perpendicularly to the normal direction N1 of the substrate 3, the circuit board 2 comprising electrically conductive first plug-in connection contacts 6, and having a capacitor 5 which is electrically conductively connected to the substrate 3, is provided.

In a further method step b), a second arrangement having a capacitor holding element 8 which comprises a reception device 7 for receiving the capacitor 5, having a temperature sensor 9 intended for measuring the temperature of the capacitor 5, having a temperature sensor holding element 10 which comprises a plug-in connection region 11 on which electrically conductive second plug-in connection contacts 12 are arranged, the temperature sensor 9 being connected to the temperature sensor holding element 10 and the temperature sensor holding element 10 being connected to the capacitor holding element 8, having temperature sensor connecting lines 13 which electrically conductively connect the temperature sensor 9 and the second plug-in connection contacts 12 to one another, at least one section of a temperature sensor connecting line 13 being arranged inside the temperature sensor holding element 10 and being materially bonded to the temperature sensor holding element 10, and/or at least one section of a temperature sensor connecting line 13 being configured as a conductor track arranged on the temperature sensor holding element 10, is provided.

In a further method step c), a relative movement of the first and second arrangements towards one another is carried out in such a way that the capacitor 5 is inserted into the reception device 7 and the second plug-in connection contacts 12 form an electrically conductive plug-in connection with the first plug-in connection contacts 6.

A further method for producing the power semiconductor device 1 according to the invention will be described below, the temperature sensor holding element 10 being connected to the capacitor holding element 8 in the power semiconductor device 1 by the temperature sensor holding element 10 being connected to the capacitor holding element 8 by means of a force-fit or form-fit connection.

In a method step a), a first arrangement having a substrate 3 on which power semiconductor switches 4 are arranged and are electrically conductively connected to the substrate 3, having a circuit board 2, the normal direction N2 of which extends perpendicularly to the normal direction N1 of the substrate 3, the circuit board 2 comprising electrically conductive first plug-in connection contacts 6, and having a capacitor 5 which is electrically conductively connected to the substrate 3, is provided.

In a further method step b), a capacitor holding element 8 which comprises a reception device 7 for receiving the capacitor 5 is provided.

In a further method step c), a temperature sensor 9 intended for measuring the temperature of the capacitor 5 and a temperature sensor holding element 10 which comprises a plug-in connection region 11 on which electrically conductive second plug-in connection contacts 12 are arranged, the temperature sensor 9 being connected to the temperature sensor holding element 10, are provided, and temperature sensor connecting lines 13 which electrically conductively connect the temperature sensor 9 and the second plug-in connection contacts 12 to one another, at least one section of a temperature sensor connecting line 13 being arranged inside the temperature sensor holding element 10 and being materially bonded to the temperature sensor holding element 10, and/or at least one section of a temperature sensor connecting line 13 being configured as a conductor track arranged on the temperature sensor holding element 10, are provided.

In a further method step d) a second arrangement is obtained by relatively moving the first arrangement and the capacitor holding element 8 towards one another in such a way that the capacitor 5 is inserted into the reception device 7.

In a further method step e) a relative movement of the temperature sensor holding element 10 and the second arrangement towards one another is carried out in such a way that the temperature sensor holding element 10 is connected to the capacitor holding element 8 with a force fit or form fit and the second plug-in connection contacts 12 form an electrically conductive plug-in connection with the first plug-in connection contacts 6.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:
1. A power semiconductor device, comprising:
a substrate on which a plurality of power semiconductor switches are arranged and are electrically conductively connected to the substrate, and a circuit board, defining a normal direction (N2) that extends perpendicularly to a normal direction (N1) of the substrate;

the circuit board further comprising:
- a plurality of electrically conductive first plug-in connection contacts, each having a respective capacitor which is electrically conductively connected to the substrate;
- a capacitor holding element which further comprises:
  - a reception device for receiving the capacitor, the respective capacitors being arranged in the reception device;
  - a temperature sensor that measures the temperature of the capacitor;
  - a temperature sensor holding element which comprises a plug-in connection region on which electrically conductive second plug-in connection contacts are arranged;
  - the temperature sensor being connected to the temperature sensor holding element and the temperature sensor holding element being connected to the capacitor holding element;
  - at least one temperature sensor connecting line which respectively electrically conductively connects the temperature sensor and the second plug-in connection contacts to one another;
  - at least one section of the at least one temperature sensor connecting line being arranged inside the temperature sensor holding element and being materially bonded to the temperature sensor holding element; and
  - at least one section of the at least one temperature sensor connecting line being configured as a conductor track arranged on the temperature sensor holding element;
  - wherein the second plug-in connection contacts form an electrically conductive plug-in connection with the first plug-in connection contacts.

2. The power semiconductor device, according to claim 1, wherein:
- the temperature sensor holding element is formed from plastic;
- the at least one section of the temperature sensor connecting line is arranged inside the temperature sensor holding element and is materially bonded to the temperature sensor holding element by the at least one section of the temperature sensor connecting line being injection-molded into the temperature sensor holding element.

3. The power semiconductor device, according to claim 2, wherein:
- the temperature sensor holding element is formed from plastic;
- the temperature sensor being connected to the temperature sensor holding element by at least a part of the temperature sensor being injection-molded into the temperature sensor holding element.

4. The power semiconductor device, according to claim 3, wherein:
- a signal processing circuit for signal processing of a temperature sensor signal generated by the temperature sensor is arranged on the circuit board.

5. The power semiconductor device, according to claim 4, wherein:
- a plurality of driver control circuits for driving the power semiconductor switches are arranged on the circuit board.

6. The power semiconductor device, according to claim 5, further comprising a base plate, the substrate being arranged on the base plate.

7. The power semiconductor device, according to claim 6, wherein:
- the base plate is an integral part of a heat sink.

8. The power semiconductor device, according to claim 5, wherein:
- the first plug-in connection contacts are configured as metallization regions of the circuit board.

9. The power semiconductor device, according to claim 8, wherein:
- at least two of the first plug-in connection contacts are arranged on mutually opposite main sides of the circuit board.

10. The power semiconductor device, according to claim 9, wherein:
- the temperature sensor is thermally conductively coupled to the capacitor.

11. The power semiconductor device, according to claim 10, wherein:
- the temperature sensor holding element is connected to the capacitor holding element by the temperature sensor holding element being formed in one piece with the capacitor holding element.

12. The power semiconductor device, according to claim 11, wherein:
- the temperature sensor holding element is connected to the capacitor holding element by the temperature sensor holding element being connected to the capacitor holding element by one of a force-fit or a form-fit connection.

13. A method for producing a power semiconductor device, according to claim 1, comprising the steps of:
- a) providing a first arrangement having said substrate on which said power semiconductor switches are arranged and are electrically conductively connected to the substrate, having said circuit board, and the normal direction (N2) of the circuit board extends perpendicularly to the normal direction (N1) of the substrate, the circuit board further comprising said electrically conductive first plug-in connection contacts, and having said capacitor which is electrically conductively connected to the substrate;
- b) providing a second arrangement having said capacitor holding element which comprises said reception device for receiving the capacitor, having said temperature sensor for measuring the temperature of the capacitor, and having said temperature sensor holding element which comprises said plug-in connection region on which said electrically conductive second plug-in connection contacts are arranged, and the temperature sensor being connected to the temperature sensor holding element and the temperature sensor holding element being connected to the capacitor holding element, having temperature sensor connecting lines which electrically conductively connect the temperature sensor and the second plug-in connection contacts to one another, said at least one section of a temperature sensor connecting line being arranged inside the temperature sensor holding element and being materially bonded to the temperature sensor holding element, and said at least one section of a temperature sensor connecting line being configured as said conductor track arranged on the temperature sensor holding element; and
- c) relatively moving the first and second arrangements towards one another so that the capacitor is inserted into the reception device and the second plug-in connection contacts form an electrically conductive plug-in connection with the first plug-in connection contacts.

14. A method for producing a power semiconductor device, according to claim 12, comprising the steps of:
- a) providing a first arrangement having said substrate on which said power semiconductor switches are arranged and are electrically conductively connected to the substrate, having said circuit board, the normal direction (N2) of which extends perpendicularly to the normal direction (N1) of the substrate, the circuit board comprising electrically conductive first plug-in connection contacts, and having said capacitor which is electrically conductively connected to the substrate;
- b) providing said capacitor holding element which comprises said reception device for receiving the capacitor;
- c) providing said temperature sensor intended for measuring the temperature of the capacitor and said temperature sensor holding element which comprises said plug-in connection region on which electrically conductive second plug-in connection contacts are arranged, the temperature sensor being connected to the temperature sensor holding element, and providing temperature sensor connecting lines which electrically conductively connect the temperature sensor and the second plug-in connection contacts to one another, at least one section of a temperature sensor connecting line being arranged inside the temperature sensor holding element and being materially bonded to the temperature sensor holding element, and at least one section of said temperature sensor connecting line being configured as said conductor track arranged on the temperature sensor holding element;
- d) obtaining said second arrangement by relatively moving the first arrangement and the capacitor holding element towards one another in such a way so that the capacitor is inserted into the reception device; and
- e) relatively moving the temperature sensor holding element and the second arrangement towards one another in such a way that the temperature sensor holding element is connected to the capacitor holding element with one of a force fit and a form fit, and the second plug-in connection contacts form said electrically conductive plug-in connection with the first plug-in connection contacts.

\* \* \* \* \*